United States Patent
Park (10) Patent No.: US 7,110,276 B2
(45) Date of Patent: Sep. 19, 2006

(54) INTEGRATED CIRCUIT MEMORY DEVICES REDUCING PROPAGATION DELAY DIFFERENCES BETWEEN SIGNALS TRANSMITTED TO SEPARATE SPACED-APART MEMORY BLOCKS THEREIN

(75) Inventor: Min-Sang Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 154 days.

(21) Appl. No.: 10/855,121

(22) Filed: May 27, 2004

(65) Prior Publication Data
US 2005/0047187 A1 Mar. 3, 2005

(30) Foreign Application Priority Data
Aug. 29, 2003 (KR) ............ 10-2003-0060330

(51) Int. Cl.
G11C 5/06 (2006.01)
(52) U.S. Cl. ............ 365/63; 365/230.03; 365/189.05

(58) Field of Classification Search ............ 365/63, 365/230.03, 189.05
See application file for complete search history.

(56) References Cited

U.S. PATENT DOCUMENTS

| 5,946,712 A | 8/1999 | Lu et al. ............ 711/167 |
| 6,026,051 A | 2/2000 | Keeth et al. ............ 365/233 |
| 6,975,527 B1 * | 12/2005 | Park ............ 365/63 |

FOREIGN PATENT DOCUMENTS

JP 01161912 A 6/1989

* cited by examiner

*Primary Examiner*—Huan Hoang
(74) *Attorney, Agent, or Firm*—Myers Bigel Sibley & Sajovec, PA (57) ABSTRACT

Integrated circuit memory devices can include a plurality of conductor paths that are electrically coupled to all memory blocks included in separate memory arrays of the device and are configured for access together during a read or write operation. All of the conductor paths are configured to reduce differences in propagation delays of signals conducted thereon.

18 Claims, 5 Drawing Sheets

INTEGRATED CIRCUIT MEMORY DEVICES REDUCING PROPAGATION DELAY DIFFERENCES BETWEEN SIGNALS TRANSMITTED TO SEPARATE SPACED-APART MEMORY BLOCKS THEREIN

CROSS-REFERENCE TO RELATED APPLICATION

This application claims priority to Korean Patent Application No. 2003-0060330, filed on Aug. 29, 2003, in the Korean Intellectual Property Office, the content of which is incorporated herein by reference in its entirety.

FIELD OF THE INVENTION

The invention relates to integrated circuit devices and, more specifically, to signal distribution in integrated circuit memory devices.

BACKGROUND

As integrated circuit memory devices become more highly integrated and complex, the operational speed of the device may be increased. As the capacity of the memory increases the propagation delays of signals therein may become a significant portion of timing in the memory. Specifically, the propagation delay of input signals (e.g., an address signal) used to drive a decoder may be an issue as the input signals may be relatively far from the decoder.

In addition, word lines connected to the gates of cell transistors may be formed of poly silicon, which may have a large resistivity. Also, since the word lines may pass above a gate oxide layer of the cell transistor, the capacitance C may be significant, which may increase an associated RC delay as the length of the word line increases. To compensate for the increased RC delay of the word line, the word line voltage may be increased, which may also increase the area occupied by a row decoder. Furthermore, if the bit line becomes long, the resistance R and capacitance C associated therewith may also be increased, which may also increase an area of the row decoder.

Since the word lines and the bit lines are long-distance interconnects, the propagation delay of each may be long. Furthermore, the size of the decoder may also increase as a memory block size is increased, which may also increase delay time due to, for example, increased decoding time.

It is known to divide memory banks into memory blocks (e.g., four memory blocks), and a decoder is used for each memory block in the bank. This approach has been used due to some of the advantages of this approach, such as operational speed. However, this approach also offers some disadvantages, such as power consumption. However, there are advantages in aspect of operation speed or power consumption, so that this manner has been widely used recently.

Figure 1:
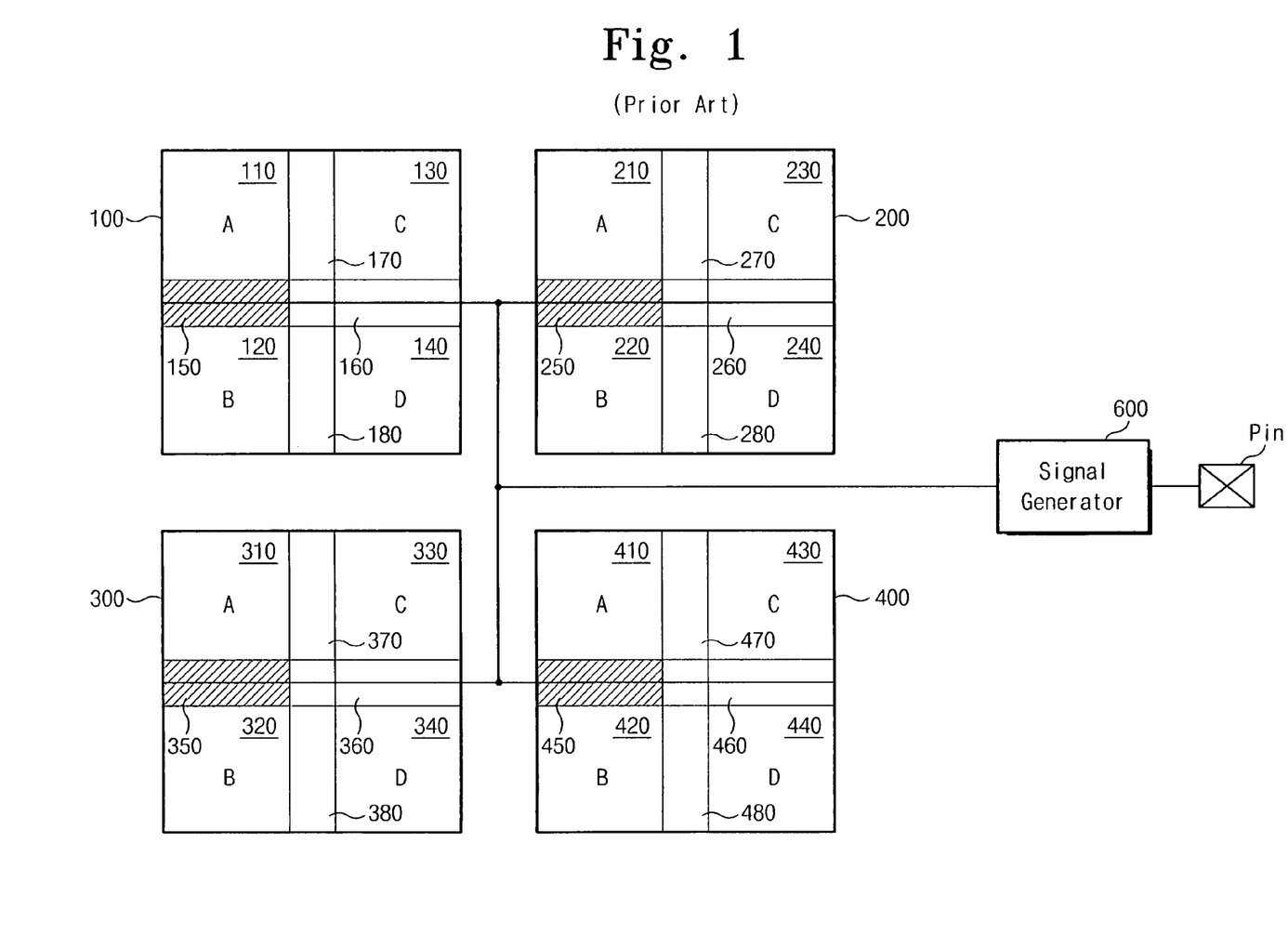
FIG. 1 is a block diagram of a conventional integrated circuit memory device.

FIG. 1 is a block diagram showing a conventional memory partitioning approach including input signals. It will be understood that the arrangement of only one memory bank is discussed below, however, the arrangements in the remaining memory banks are analogous to the arrangement discussed. As shown in FIG. 1, a memory cell array can be divided into two memory banks 100, 200. Each of the memory banks (e.g., 100 in FIG. 1) is divided into four memory blocks 110, 120, 130 and 140. Decoders 150, 160, 170 and 180 are located between each memory block. The memory banks 100, 200 are arranged in a matrix shape.

A signal generator 600 generates address signals for selecting a specific address in a memory block, which is input to the decoder. In particular, the address signal shown selects memory blocks 110, 210, 310 and 410, which are located in each of the memory banks 100, 200, 300 and 400. The difference in the lengths of the lines which carry the address signal to the different memory blocks may cause an access in each of the memory blocks 110, 210, 310 and 410 in the separate memory banks to occur at slightly different times. However, if the size of the memory blocks A, B, C, and D becomes too large, and the decoder becomes too long, the distance that a address signal may have to propagate may become so long that a difference in phase may be introduced between the signals in the different memory blocks. For example, the time for driving the A blocks 110 and 310 may be longer than the time for driving the A blocks 210 and 410 as the address signal must travel farther to reach the A blocks 110 and 310. Additionally, if the decoder becomes to long, an address signal may be is incapable of full swing so that a high frequency characteristic may be reduced. In addition, the rising/falling time may depend on position of the block.

SUMMARY

Embodiments according to the invention can provide integrated circuit memory devices that may reduce propagation delay differences between signals transmitted to separate spaced-apart memory sub-blocks therein. Pursuant to these embodiments, integrated circuit memory devices can include a plurality of conductor paths that are electrically coupled to all memory blocks included in separate memory arrays of the device and are configured for access together during a read or write operation. All of the conductor paths are configured to reduce differences in propagation delays of signals conducted thereon.

In some embodiments according to the invention, the plurality of conductor paths extend away from a common node located between first and second separate memory banks including first and second memory blocks respectively, wherein the first and second memory blocks are located within the first and second memory arrays substantially equidistant from the common node. In some embodiments according to the invention, a delay circuit is included in the plurality of conductor paths, wherein the conductor paths extend away from a common node located between separate first and second memory banks includes the first and second memory blocks respectively. The first and second memory blocks are located between the common node and other respective memory blocks included in each of the first and second memory banks. In some embodiments according to the invention, first and second buffer circuits are included in the plurality of conductor paths.

In some embodiments according to the invention, the plurality of conductor paths extend away from a common node located between separate first and second memory banks that include the first and second memory blocks respectively. The first and second memory blocks are located within the first and second memory arrays first and second unequal lengths from the common node. A delay circuit is included in the conductor path that is shorter in length from the common node to the respective memory block.

In some embodiments according to the invention, the conductor path that is longer in length is without any delay circuit. In some embodiments according to the invention, first and second buffer circuits are included in the conductor paths. In some embodiments according to the invention, the conductor paths terminate at respective first and second address decoders within the first and second memory arrays.

In some embodiments according to the invention, an integrated circuit memory device can include a first conductor path that is electrically coupled from a common node between first and second memory arrays to a plurality of first memory blocks in the first memory array. A second conductor path is electrically coupled from the common node to a plurality of second memory blocks in the second memory array, wherein ones of the plurality of first memory blocks and ones of the plurality of second memory blocks that are located substantially equidistant from the common node are configured for access together during a memory read or write operation.

In some embodiments according to the invention, an integrated circuit memory device can include a first conductor path that is electrically coupled from a common node between first and second memory arrays to a plurality of first memory blocks in the first memory array. A second conductor path is electrically coupled from the common node to a plurality of second memory blocks in the second memory array, wherein ones of the plurality of first memory blocks and ones of the plurality of second memory blocks that are located different distances from the common node are configured for access together during a memory read or write operation. A delay circuit is included in the first or second conductor path that extends a shorter distance between the common node and respective memory block.

DETAILED DESCRIPTION OF EMBODIMENTS ACCORDING TO THE INVENTION

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that although the terms first and second may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Figure 2A:
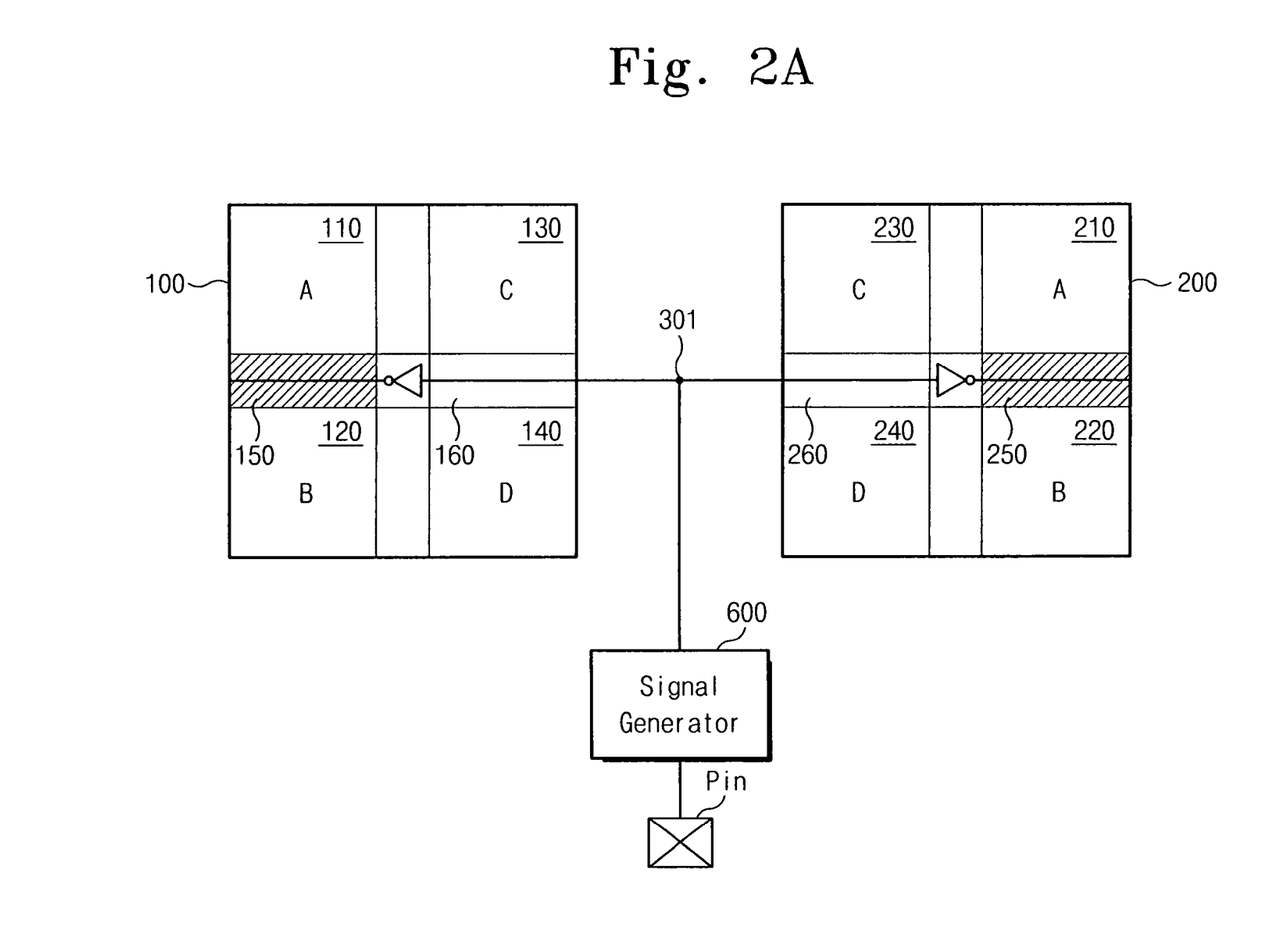
FIGS. 2A and 2B are block diagrams of integrated circuit memory devices according to some embodiments of the invention.
Figure 2B:
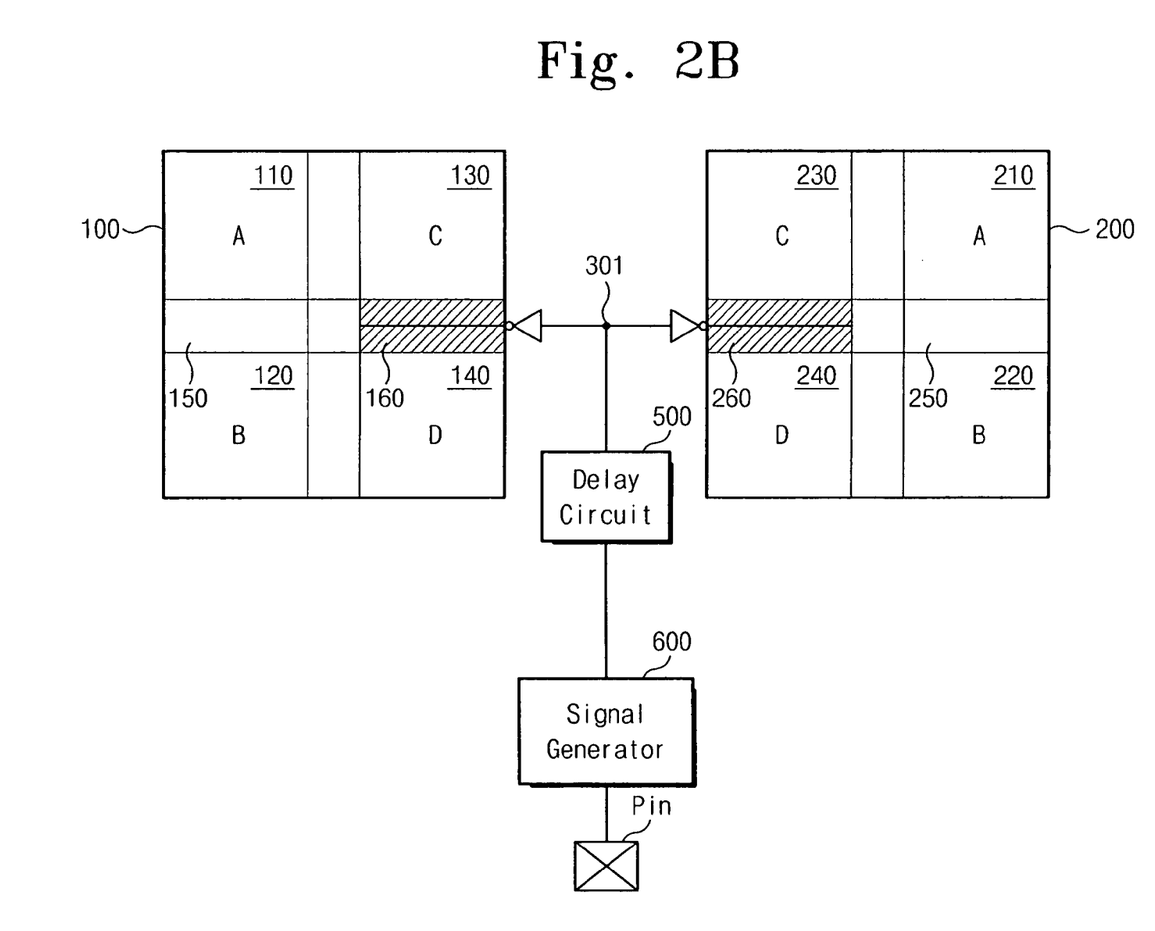

FIGS. 2A and 2B are block diagrams that illustrate memory banks including memory blocks according to some embodiments of the invention. Although the integrated circuit memory device illustrated in FIGS. 2A and 2B is shown as having separate memory banks, it will be understood that the integrated circuit memory device illustrated is a single integrated circuit memory device. Although FIGS. 2A and 2B show four memory banks, the integrated circuit memory device is described herein primarily with reference to only two memory banks 100 and 200 for convenience. Also, although the integrated circuit memory device is illustrated with four memory banks, it will be understood that some integrated circuit memory devices according to embodiments of the invention may include more than four memory banks.

According to some embodiments of the invention, a plurality of conductor paths are electrically coupled to all memory blocks included in separate memory arrays of the device and are configured for access together during a read or write operation. Moreover, all of the conductor paths are configured to reduce differences in propagation delays of signals conducted thereon. Accordingly, each of the separate memory blocks accessed during a memory read or write operation can be accessed substantially at the same time despite what may be relatively large distances separating the accessed separate memory blocks.

Referring to FIG. 2A, a memory cell array is divided into two memory banks 100 and 200. The memory banks 100 and 200 are each subdivided into four memory blocks A, B, C, and D with designators 110, 120, 130, and 140 respectively. Decoders 150 and 250 are located between the A/B blocks 110/120 and 210/220 respectively. The decoders 150 and 250 apply a high voltage to a word line or a bit line which are selected (or non-selected) by decoding an input signal (such as an address signal).

The integrated circuit memory device shown in FIG. 2A includes a symmetrical arrangement of the memory blocks A, B, C and D about a space that separates the memory banks. The space includes a common node 301 from which an address signal can be distributed to each of the memory blocks that are configured for access together during a memory read or write operation in accordance with some embodiments of the invention. In other words, the memory blocks 110/210 are configured to be accessed together (i.e., store/retrieve data) responsive to an address decode.

The memory blocks to which the address signal is distributed can be substantially equidistant from the common node. In contrast, conventional memory blocks (as shown, for example, in FIG. 1) may be arranged in parallel to the direction of a horizontal axis or vertical axis. However, in some embodiments according to the invention, the memory blocks A, B, C and D are arranged symmetric with respect to the vertical axis (a Y axis). For example, the A block 110 and the A block 210 are symmetric with respect to the Y axis defined to pass through the common node. Accordingly, a phase difference developed as a result of unequal propagation delays of the signal to the separate memory bocks may be reduced as the distances from the common node to the memory blocks accessed during a memory read or write operation is substantially equalized so that, for example, an address signal may be provided to both decoders 150 and 250 substantially simultaneously. It will be understood that the other memory blocks shown in FIG. 2A are also arranged as described above.

A signal generator 600 generates an address signal for selecting a specific address included in the A memory blocks 110 and 210 that are configured for access together during a memory read or write operation. The address signal is carried to the separate memory blocks from the common node via first and second conductor paths that extend in opposite directions toward the decoders 150 and 250 in each of the memory blocks 110/210. In addition, the signal generator 600 generates an address signal for interlocking the memory blocks 110 and 210 substantially simultaneously in memory banks 100 and 200. Accordingly, it is possible to reduce a phase difference that may otherwise occur when the signal that propagates to a decoder experiences different amounts of delay to separate memory blocks.

According to some embodiments of the invention, the first and second conductor paths include an amplifier means to provide/restore a high frequency characteristic to the signal before it is input to the decoder. For instance, as shown in FIG. 2A, a signal passes through an inverter (or a buffer) before it is input to the decoders 150 and 250. As a result, as the loading of the signal is decreased, skew may be decreased, and a edge time (rising/falling time) for the signal may be reduced.

Referring to FIG. 2B, memory blocks 130 and 230 are located between the memory blocks 110 and 210 and the space that separates the memory banks 100, 200. In other words, memory blocks 130 and 230 are located closer to the vertical axis (Y axis) defined above in reference to FIG. 2A in comparison with the memory blocks 110 and 210. A block arrangement and operations for driving the memory blocks 130 and 230 are analogous to those of the memory blocks 110 and 210, and the description thereof is omitted here.

Referring to FIG. 2B, the first and second conductor paths include a delay circuit 500. The delay circuit 500 can include any type of delay device, such as inverters or buffers. The delay circuit 500 is included so that the memory blocks 110 and 210 and the memory blocks 130 and 230 can be driven substantially simultaneously despite the fact that the memory blocks 130/230 are closer to the common node than the memory blocks 110/210. Accordingly, the delay circuit 500 is added to delay the signals input to the memory blocks that are closer to the common node (i.e., located nearer to the defined Y axis).

Figure 3A:
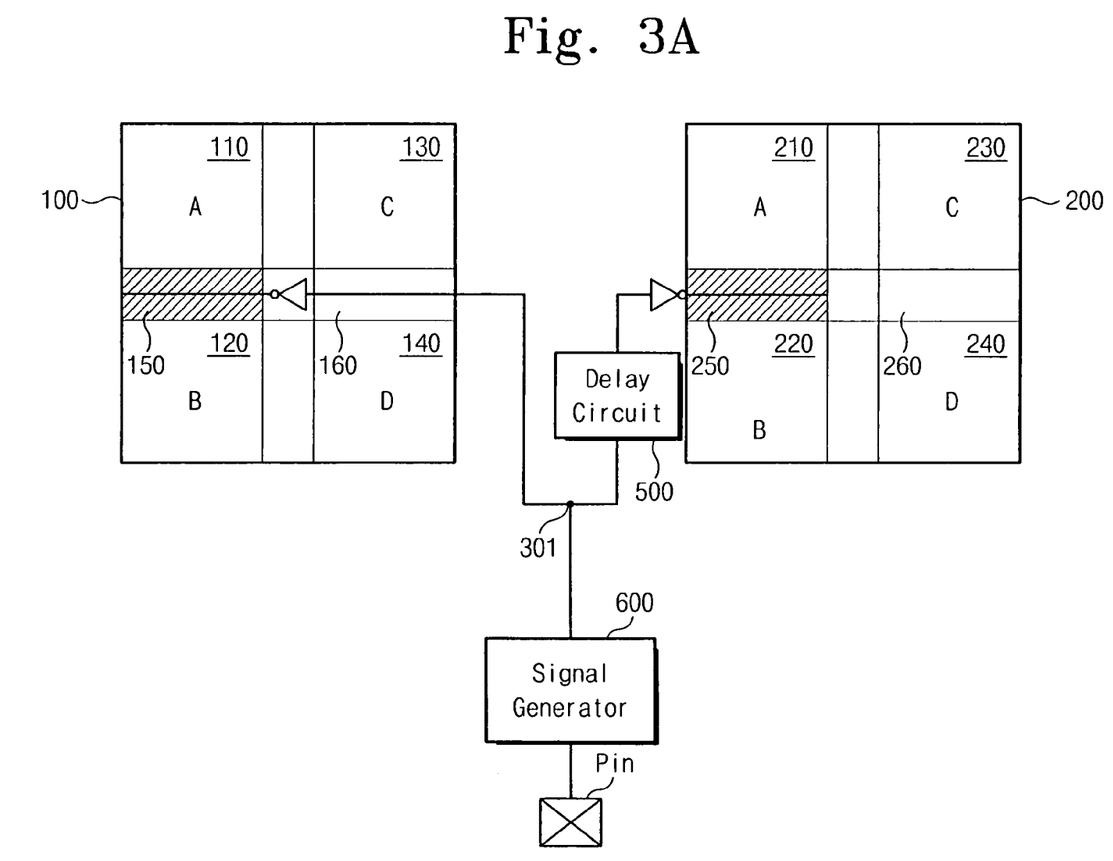
FIGS. 3A and 3B are block diagrams of integrated circuit memory devices according to some embodiments of the invention.
Figure 3B:
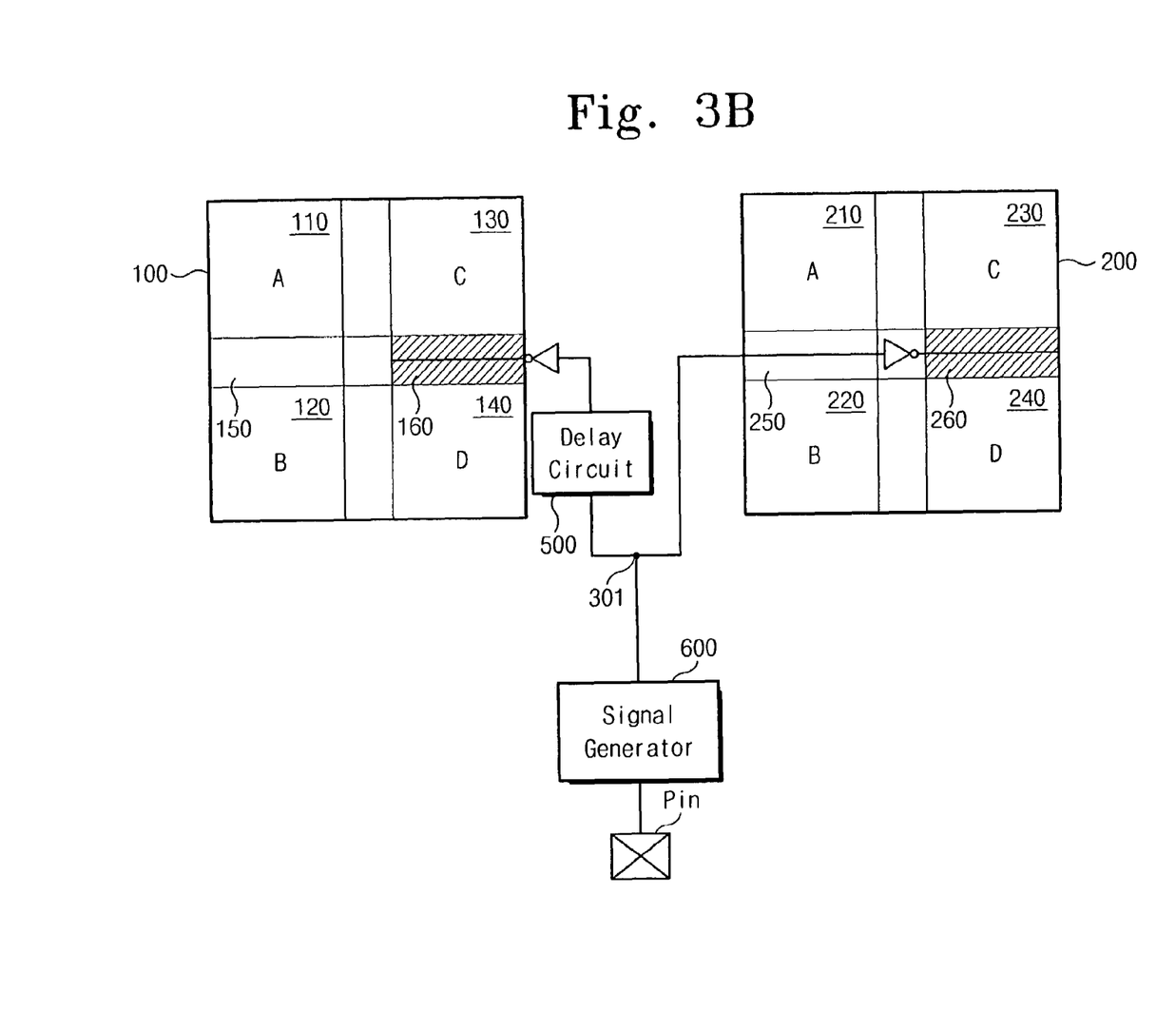

FIGS. 3A and 3B are block diagrams that illustrate memory arrays according to some embodiments of the invention. The memory blocks shown in FIGS. 3A and 3B are analogous to those described above in reference to FIGS. 2A and 2B, accordingly further detailed description of the operations of these memory blocks is omitted.

Integrated circuit memory device according to some embodiments of the invention as shown in FIGS. 3A and 3B can include memory blocks A, B, C and D, decoders, a signal generator 600 and a delay circuit 500. The memory blocks A, B, C and D are transmitted in parallel in the direction of a vertical axis or a horizontal axis. In other words, the memory blocks shown in FIGS. 3A and 3B are arranged the same within each of the respective memory arrays. For example, memory blocks 110/210 are both shown in the same position within the respective memory array (i.e., upper left corner). Furthermore, the memory blocks 110/210 are configured for access together during a memory read or write operation.

First and second conductor paths extend from the signal generator to each of the memory banks via a common node 301 located in the space that separates the memory banks from one another. In particular, the first conductor path extends from the common node 301 to the memory block 110 in the memory array 100 and the second conductor path extends from the common node 301 to the memory block 210 in memory bank 200. As shown, the first conductor path is longer than the second conductor path as the memory block 110 is located farther from the common node 301 than the memory block 210. Moreover, the delay circuit 500 is included in the first conductor path to reduce a difference in the propagation delay of the signal from the common node 301 to each of the memory blocks 110/210. In other words, referring to FIG. 3A, the memory blocks A, B, and D are arranged in parallel with the direction of a vertical axis or a horizontal axis. In particular, the memory block 110 is farther to the left of the Y axis than memory block 210 (which is nearer to the Y axis).

Referring to FIG. 3A, the second conductor path includes a delay circuit 500 whereas the first conductor path is free of a delay circuit. The delay circuit 500 can include any type of delay device, such as inverters or buffers. The delay circuit 500 is included so that the memory blocks 110 and 210 can be driven substantially simultaneously despite the fact that the memory block 210 is closer to the common node than the memory block 110. Accordingly, the delay circuit 500 is added to delay the signal input to the memory block that is closer to the common node (i.e., located nearer to the defined Y axis).

Furthermore, referring still to FIG. 3A, according to some embodiments of the invention, the first and second conductor paths include an amplifier means to provide/restore a high frequency characteristic to the signal before it is input to the decoder. For instance, a signal passes through an inverter (or a buffer) before it is input to the decoders 150 and 250. As a result, as the loading of the signal is decreased, skew may be decreased, and a edge time (rising/falling time) for the signal may be reduced.

Referring to FIG. 3B, the memory block 130 is nearer to the Y axis than the memory block 230, which are configured for access together during a memory read or write operation. In this type of arrangement, the different lengths the signal lines from the common node 301 to the respective decoders can be addressed by adding the delay circuit 500 to the first conductor path.

In particular, referring to FIG. 3B, the first conductor path includes a delay circuit 500 whereas the second conductor path is free of a delay circuit. The delay circuit 500 can include any type of delay device, such as inverters or buffers. The delay circuit 500 is included so that the memory blocks 130 and 230 can be driven substantially simultaneously despite the fact that the memory block 130 is closer to the common node 301 than the memory block 230. Accordingly, the delay circuit 500 is added to delay the signal input to the memory block that is closer to the common node (i.e., located nearer to the defined Y axis).

Furthermore, referring still to FIG. 3B, according to some embodiments of the invention, the first and second conductor paths include an amplifier means to provide/restore a high frequency characteristic to the signal before it is input to the decoder. For instance, a signal passes through an inverter (or a buffer) before it is input to the decoders 150 and 250. As a result, as the loading of the signal is decreased, skew may be decreased, and a edge time (rising/falling time) for the signal may be reduced.

According to some embodiments of the invention, a plurality of conductor paths are electrically coupled to all memory blocks included in separate memory banks of the device and are configured for access together during a read or write operation. Moreover, all of the conductor paths are configured to reduce differences in propagation delays of signals conducted thereon. Accordingly, each of the separate memory blocks accessed during a memory read or write operation can be accessed substantially at the same time despite what may be relatively large distances separating the accessed separate memory blocks.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. An integrated circuit memory device comprising:
    a plurality of conductor paths, electrically coupled to all memory blocks included in separate first and second memory banks of the device and configured for access together during a read or write operation, wherein all of the conductor paths are configured to reduce differences in propagation delays of signals conducted thereon; and
    wherein the plurality of conductor paths extend away from a common node located between the first and second memory banks including first and second memory blocks respectively; and
    wherein the first and second memory blocks are located within the separate first and second memory banks substantially equidistant from the common node.

2. A device according to claim 1 further comprising:
    a delay circuit included in the plurality of conductor paths, wherein the conductor paths extend away from a common node located between the separate first and second memory banks including the first and second memory blocks respectively;
    wherein the first and second memory blocks are located between the common node and other respective memory blocks included in each of the first and second separate memory banks.

3. A device according to claim 1 further comprising:
    first and second buffer circuits included in the plurality of conductor paths.

4. A device according to claim 1 wherein the first and second memory blocks are located within the separate first and second memory banks first and second unequal lengths from the common node, the device further comprising:
    a delay circuit included in the conductor path that is shorter in length from the common node to the respective memory block.

5. A device according to claim 4 wherein the conductor path that is longer in length is without any delay circuit.

6. A device according to claim 4 further comprising:
    first and second buffer circuits included in the conductor paths.

7. A device according to claim 1 wherein the conductor paths terminate at respective first and second address decoders within the first and second memory blocks.

8. An integrated circuit memory device comprising:
    a first conductor path electrically coupled from a common node between first and second memory banks to a plurality of first memory blocks in the first memory bank;
    a second conductor path electrically coupled from the common node to a plurality, of second memory blocks in the second memory bank, wherein ones of the plurality of first memory blocks and ones of the plurality of second memory blocks that are located substantially equidistant from the common node are configured for access together during a memory read or write operation.

9. A device according to claim 8 further comprising:
    third and fourth conductor paths that electrically coupled the common node to selected ones of the pluralities of first and second memory blocks that are located between other ones of the pluralities of first and second memory blocks and the common node; and
    a delay circuit included in the third and fourth conductor paths.

10. A device according to claim 8 further comprising:
    first and second buffer circuits included in the first and second conductor paths.

11. A device according to claim 8 wherein the first and second conductor paths terminate at respective first and second address decoders within the first and second memory blocks.

12. An integrated circuit memory device comprising:
    a first conductor path electrically coupled from a common node between first and second memory banks to a plurality of first memory blocks in the first memory bank;
    a second conductor path electrically coupled from the common node to a plurality of second memory blocks in the second memory bank, wherein ones of the plurality of first memory blocks and ones of the plurality of second memory blocks that are located different distances from the common node are configured for access together during a memory read or write operation; and
    a delay circuit included in the first or second conductor path that extends a shorter distance between the common node and respective memory block.

13. A device according to claim 12 wherein the first or second conductor path that is longer in length is without any delay circuit.

14. A device according to claim 13 wherein a delay associated with the delay circuit is configured to equalize propagation delays associated with conducting the first and second signals to the respective memory blocks configured for access together.

15. A device according to claim 12 wherein the first and second conductor paths terminate at respective first and second address decoders within the first and second memory banks.

16. An integrated circuit memory device comprising:
    a plurality of first and second opposing memory blocks symmetrically arranged on both sides of a vertical axis extending along a space therebetween, wherein selected pairs of the symmetrically arranged plurality of first and second opposing memory blocks are configured for access together during a memory read or write operation;
    first and second conductor paths extending different distances in opposite directions from a common node in the space to a selected pair of the plurality of first and second opposing memory blocks; and
    a delay circuit included in a shorter one of the first and second conductor paths to reduce a phase difference of signals conducted thereon created by the different distances from the common node to the selected pair of the plurality of first and second opposing memory blocks.

17. A device according to claim 16 wherein the first or second conductor path that is longer in length is without any delay circuit.

18. A device according to claim 16 further comprising:
    first and second buffer circuits included in the first and second conductor paths.

* * * * *

UNITED STATES PATENT AND TRADEMARK OFFICE
CERTIFICATE OF CORRECTION

| | | |
|---|---|---|
| PATENT NO. | : 7,110,276 B2 | Page 1 of 1 |
| APPLICATION NO. | : 10/855121 | |
| DATED | : September 19, 2006 | |
| INVENTOR(S) | : Park | |

It is certified that error appears in the above-identified patent and that said Letters Patent is hereby corrected as shown below:

Column 7,
Line 57 should read -- common node to a plurality of second memory blocks --

Signed and Sealed this

Twenty-third Day of January, 2007

JON W. DUDAS
*Director of the United States Patent and Trademark Office*